(12) United States Patent
Kolbert et al.

(10) Patent No.: US 10,433,452 B2
(45) Date of Patent: Oct. 1, 2019

(54) ELECTRICAL DEVICE, MODEL SERIES OF ELECTRICAL DEVICES, AND PRODUCTION METHOD

(71) Applicant: SEW-EURODRIVE GMBH & CO. KG, Bruchsal (DE)

(72) Inventors: Alexander Kolbert, Weingarten (DE); Dirk Momann, Bruchsal (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 0 days.

(21) Appl. No.: 15/547,452

(22) PCT Filed: Dec. 18, 2015

(86) PCT No.: PCT/EP2015/002560
§ 371 (c)(1),
(2) Date: Jul. 28, 2017

(87) PCT Pub. No.: WO2016/119808
PCT Pub. Date: Aug. 4, 2016

(65) Prior Publication Data
US 2018/0007805 A1    Jan. 4, 2018

(30) Foreign Application Priority Data

Jan. 28, 2015   (DE) .................. 10 2015 000 939

(51) Int. Cl.
*H05K 7/14* (2006.01)
*H05K 1/02* (2006.01)
(Continued)

(52) U.S. Cl.
CPC ......... *H05K 7/1432* (2013.01); *H05K 1/0203* (2013.01); *H05K 1/0286* (2013.01);
(Continued)

(58) Field of Classification Search
CPC ...... H05K 7/1432; H05K 3/303; H05K 5/006; H05K 1/0203; H05K 1/144; H05K 1/112;
(Continued)

(56) References Cited

U.S. PATENT DOCUMENTS 6,201,701 B1 * 3/2001 Linden ................ H05K 1/0206
174/252
8,646,568 B2   2/2014 Yamasaki
(Continued)

FOREIGN PATENT DOCUMENTS

DE         102 24 168 A1   12/2003
DE   10 2005 054 601 A1    5/2007
(Continued)

OTHER PUBLICATIONS

Nakajima Akio, "Motor Inverter Device", May 7, 2015, NTN Toyo Bearing Co Ltd, Entire Document (Translation of WO2015064408).*
(Continued)

*Primary Examiner* — Jayprakash N Gandhi
*Assistant Examiner* — Stephen S Sul
(74) *Attorney, Agent, or Firm* — Hunton Andrews Kurth LLP

(57) ABSTRACT

In an electrical device, a model series of electrical devices, and a production method, in particular for a converter, having a circuit board including circuit traces, the circuit board has two similar and/or identical contact area arrays, the contact area arrays in particular transitioning into each other through rotation and/or displacement. A first contact area array of the contact area arrays is fitted with a first power module, and the second contact area array is able to be fitted with a second power module, e.g., so that a respective electric motor is able to be supplied from the respective power module.

16 Claims, 4 Drawing Sheets

(51) Int. Cl.
*H05K 1/11* (2006.01)
*H05K 1/14* (2006.01)
*H05K 1/18* (2006.01)
*H05K 3/30* (2006.01)
*H05K 5/00* (2006.01)
*H05K 7/20* (2006.01)

(52) U.S. Cl.
CPC ............ *H05K 1/112* (2013.01); *H05K 1/144* (2013.01); *H05K 1/181* (2013.01); *H05K 3/303* (2013.01); *H05K 5/006* (2013.01); *H05K 7/209* (2013.01); *H05K 2201/042* (2013.01); *H05K 2201/049* (2013.01); *H05K 2201/09036* (2013.01); *H05K 2201/09972* (2013.01); *H05K 2201/1003* (2013.01); *H05K 2201/10022* (2013.01); *H05K 2201/10121* (2013.01); *H05K 2201/10166* (2013.01); *H05K 2201/10189* (2013.01); *H05K 2201/10287* (2013.01); *H05K 2201/10356* (2013.01); *H05K 2201/10409* (2013.01); *H05K 2201/10522* (2013.01)

(58) Field of Classification Search
CPC .. H05K 1/181; H05K 7/209; H05K 2201/042; H05K 2201/10189; H05K 2201/10166; H05K 2201/10409; H05K 2201/10022; H05K 2201/1003; H05K 2201/10522
USPC .......... 361/679.01, 688, 704, 707, 709, 710, 361/720, 736, 748, 760, 761
See application file for complete search history.

(56) References Cited

U.S. PATENT DOCUMENTS

| | | | | |
|---|---|---|---|---|
| 2001/0017766 A1* | 8/2001 | Murowaki | ............ | H05K 1/147 361/752 |
| 2006/0250765 A1* | 11/2006 | Yamabuchi | ........ | H05K 7/20927 361/679.01 |
| 2009/0057006 A1* | 3/2009 | Kishibata | ............... | H05K 3/284 174/521 |
| 2010/0026090 A1* | 2/2010 | Nakatsu | ............ | H05K 7/20927 307/9.1 |
| 2012/0160596 A1* | 6/2012 | Yamasaki | ............ | B62D 5/0406 180/443 |
| 2013/0021749 A1* | 1/2013 | Nakajima | ............ | H02M 7/003 361/689 |
| 2013/0312931 A1* | 11/2013 | Sharaf | .................... | H05K 7/209 165/67 |

FOREIGN PATENT DOCUMENTS

| | | |
|---|---|---|
| DE | 10 2006 032 441 A1 | 1/2008 |
| DE | 10 2011 056 396 A1 | 6/2012 |
| JP | WO 2015064408 A1 * | 5/2015 ............ H02M 7/003 |

OTHER PUBLICATIONS

International Search Report and Written Opinion of the International Searching Authority, dated Apr. 25, 2016, in International Application No. PCT/EP2015/002560. (English-language translation).

International Preliminary Report on Patentability, dated Aug. 1, 2017, in International Application No. PCT/EP2015/002560. (English-language translation).

* cited by examiner

ELECTRICAL DEVICE, MODEL SERIES OF ELECTRICAL DEVICES, AND PRODUCTION METHOD

FIELD OF THE INVENTION

The present invention relates to an electrical device, to a model series of electrical devices, and to a production method.

BACKGROUND INFORMATION

An electrical device having plug connectors is described in German Published Patent Application No. 10 2005 054 601.

SUMMARY

Example embodiments of the present invention provide an electrical device, a model series of electrical devices, and a production method, while providing better protection of the environment.

According to an example embodiment of the present invention, an electrical device, e.g., a converter, includes a circuit board with circuit traces. The circuit board has two similar and/or identical contact area arrays, the contact area arrays in particular transitioning into each other through rotation and/or displacement. A first contact area array of the contact area arrays is fitted with a first power module, and the second contact area array is able to be fitted with a second power module.

This has the advantage of allowing the production of electrical devices for the supply of one or two electric motor(s) having an identical circuit board. Each electric motor may be supplied from the corresponding power module independently of the respective other electric motor.

Two electric motors may be able to be supplied with different powers by mounting two power modules that provide different power outputs.

Two identical circuit boards may be used for an electrical device for the supply of two electric motors and for an electrical device for the supply of one electric motor. A modular system of electrical devices having a component that may be used in different variants is able to be implemented. The stocking of different components is able to be reduced and the environment is better protected.

A separate electric motor may be able to be supplied from the respective power module. This offers the advantage that the electric motors may be controlled separately from each other.

The circuit board may have a via, which is connected to a contact area of the second contact-area array in an electrically conductive manner by circuit traces on the circuit board. This has the advantage that the via is connectable to a cable in an electrically conductive manner. An end region of the cable may be inserted into the via in an uncomplicated manner and connected to the via by soldering, thereby making it possible to save circuit traces on the circuit board. The number of empty fitting slots and blindly ending circuit traces on the circuit board is able to be reduced when using only the first power module.

The circuit board may be fitted with electrical components, and the second contact-area array may be situated in electrical isolation from all of these electrical components. This is considered advantageous insofar as the second power module that may be fitted on the second contact-area array is able to be controlled independently of the first power module.

The second power module may not be mounted. This is considered advantageous insofar as an identical circuit board may be used for electrical devices that have one power module or for electrical devices that have two power modules. A modular system of electrical devices having a component that is able to be used in different variants is implementable. The stocking of different components can be reduced, which is better for the environment.

The circuit board may have a fitting slot which is suited for the electrical contacting of an electrical component of the same type as a first electrical component, especially the electrical components; the fitting slot may be set apart and/or situated so as to be electrically insulated from the first electrical component. This is considered advantageous insofar as additional electrical components for the control and/or the supply of the second power module are able to be mounted on the circuit board. For example, these additional components are not used in the electrical device for the supply of one electric motor. In other words, these additional components are saved.

The fitting slot may be connected to a contact area of the second contact-area in an electrically conductive manner. This offers the advantage that the second power module mounted on the second contact-area array is easily able to be connected to an electrical component situated in the fitting slot in an electrically conductive manner, e.g., with the aid of circuit traces on the circuit board.

The first electrical component may be arranged as a transformer or a current-measuring resistor or an optocoupler or a brake-control means. This offers the advantage that different electrical components for the control and/or supply of the second power module may be mounted on the circuit board.

The electrical device may include a heat sink, which is thermally conductively connected to the first power module; it is possible to connect the heat sink to the second power module in a thermally conductive manner. This offers the advantage that two identical heat sinks may be used for an electrical device that has one power module and for an electrical device that has two power modules. A modular system of electrical devices having a component that may be used in different variants may be provided. The stocking of different components is able to be reduced and the environmental is better protected.

The heat sink may extend parallel to the circuit-board plane of the circuit board, from the first power module to the second contact-area array, and may be set apart from the second contact-area array. This has the advantage that the first power module may be placed between the heat sink and the circuit board.

The second power module may be able to be placed between the heat sink and the circuit board. This is considered advantageous insofar as the second power module is easily connectable to the heat sink in a thermally conductive manner. A single heat sink may be used for dissipating the heat of two power modules.

The circuit board may include two recesses and the heat sink may have two threaded bores; each power module may include a recess, and a screw device may be partially passed through one of the recesses in the circuit board and through the recess in the respective power module and screw-fitted to one of the threaded bores. In each case, one of the recesses in the circuit board and one of the threaded bores are aligned with each other. This has the advantage that each power module is able to be connected to the circuit board and to the heat sink with the aid of a single screw means, which saves components and is better for the environment.

The electrical device may have a first housing part and a first connector piece, which is electrically conductively connected to the first power module by circuit traces on the circuit board; the first housing part may include a recess for the first connector piece, and the first connector piece may be inserted into the recess. This offers the advantage that the first housing part at least partially forms a housing for the electrical device. The first housing part may be designed to be protected from touch. In other words, it has no recesses into which a plug connector or a similar device is inserted and which would be large enough to reach into the electrical device through the recess. Thus, no cover parts are required for such a recess.

The electrical device may include a further circuit board provided with additional circuit traces and at least one connection device, and a second connector piece; the second power module may be mounted on the circuit board, in particular on the second contact-area array, and may be electrically conductively connected to the via with the aid of the circuit traces. The second connector piece is fitted on the additional circuit board and is electrically conductively connected to the connection device by the additional circuit traces, the via being connected to the connector piece in an electrically conductive manner with the aid of a cable. This is considered advantageous insofar as the electrical device may have a compact design because the circuit boards are able to be placed at a distance from each other. The circuit boards may be set apart from each other in the normal direction to a circuit board plane, for instance in a parallel arrangement.

The position of the second connector piece on the electrical device may be selected independently of the position of the circuit board in the electrical device.

An end region of the cable may be inserted into the via and connected to the via by soldering. This is considered advantageous insofar as the cable is able to be connected to the via in an uncomplicated and secure manner.

The connection device may be mounted on the additional circuit board. This has the advantage that the connection device projects from the circuit board plane of the additional circuit board. Thus, the cable is able to be plugged into the connection device. The cable may extend in the transverse direction to the normal direction of the circuit board plane of the additional circuit board. As a result, a fracture of the cable in a compact design of the electrical device is able to be prevented and the safety of the electrical device is improved.

The additional circuit board may have a circuit board plane, and the connection device may project from the additional circuit board perpendicular to the normal direction of the circuit board plane. This is considered advantageous insofar as the connection device extends further into the interior space of the electrical device than the additional circuit board. Thus, the cable may be placed at a distance from the additional circuit board. The cable may extend substantially parallel to the normal direction of the circuit board plane.

Another end region of the cable may be plugged into the connection device. This has the advantage that the cable is able to be connected to the connection means in a simple and reliable manner. The cable may be connected to the connection device by crimping, in particular using a crimp connector.

The connection device may be implemented as a via in the additional circuit board. This has the advantage that the via is able to be produced in a single working step with the additional circuit traces on the additional circuit board. The required work is therefore able to be reduced, and the environment is better protected.

A further end region of the cable may be inserted into the connection device and may be connected to the connection device by soldering. This is considered advantageous insofar as the cable can be connected to the connection device in a simple and reliable manner.

The electrical device may have at least a second housing part, which has a first recess for a first connector piece as well as a second recess for a second connector piece; the first connector piece may be inserted into the first recess, and the second connector piece may be inserted into the second recess. This has the advantage that the first and the second connector pieces are connectable to the second housing part in an uncomplicated manner, in particular by a clip-in connection.

The second housing part may at least partially form a housing for the electrical device having two power modules. The second housing part is designed as a contact-protected part. Therefore, it has no recesses into which a plug connector or a similar device is inserted and which would be large enough to reach into the electrical device through the recess. Thus, no cover parts are needed for such a recess.

The additional circuit board may be connected to the second housing part in a reversible manner. This has the advantage of allowing for an uncomplicated exchange of the additional circuit board.

According to an example embodiment of the present invention, a model series of electrical devices, e.g., converters is provided. The model series has at least a first and a second variant. Each variant of the model series is an electrical device having a circuit board, with circuit traces, and two similar and/or identical contact-area arrays, the contact-area arrays in particular transitioning into each other through rotation and/or displacement. A first power module is mounted on a first contact-area array, and a second power module is able to be mounted on a second contact-area array. A first variant of the electrical device has a single connector piece to supply a single electric motor from the first power module, and a second variant of the electrical device has a second power module and two connector pieces to supply two independent electric motors from the respective power module.

This is considered advantageous insofar as electrical devices for the supply of one or two electric motor(s) having an identical circuit board are able to be produced. Each electric motor may be supplied from the corresponding power module independently of the respective other electric motor.

Two electric motors may be able to be supplied with different powers in that two power modules having different outputs are able to be mounted.

Two identical circuit boards are able to be used for an electrical device for the supply of two electric motors and for an electrical device for the supply of one electric motor. The modular system of electrical devices thus has a circuit board that may be used in different variants of the modular system. The stocking of different components is able to be reduced and the environment is better protected.

The first variant of the electrical device may have a first housing part which includes a recess into which the connector piece is inserted. This is considered advantageous insofar as the first housing part at least partially forms a housing for the first variant of the electrical device. The first housing part may be arranged as a contact-protected part. In other words, it has no recesses into which a plug connector or a similar device is inserted and which would be large enough to reach through the recess into the electrical device. As a result, no cover parts are required for such a recess.

In the first variant of the electrical device, the second power module may not be mounted. This has the advantage of saving unnecessary components, which is better for the environment.

The second variant of the electrical device may have a second housing part that differs from the first housing part and that has two recesses into which a respective connector piece is inserted. This is considered advantageous insofar as the first and the second connector pieces are able to be connected to the second housing part in an uncomplicated manner, in particular using a clip-in connection. The second housing part may at least partially form a housing for the second variant of the electrical device. The second housing part may be arranged as a contact-protected part. Thus, it has no recesses into which a plug connector or a similar device is inserted and which would be large enough to reach through the recess into the electrical device. For example, no cover parts have to be provided for such a recess.

The second variant may differ from the first variant in that the first housing part is replaced by the second housing part in the second variant, and the second contact-area array is fitted with the second power module. This is considered advantageous insofar as a modular system for two variants of an electrical device is able to be implemented with only a slight variance in the components. The environment is better protected as a result.

According to an example embodiment of the present invention, a method is provided for producing two variants of an electrical device, e.g., converters. The electrical device has a circuit board with circuit traces and two similar and/or identical contact-area arrays, the contact-area arrays in particular transitioning into each other through rotation and/or displacement. A first power module is able to be fitted on the first contact-area array, and a second power module is able to be fitted on the second contact-area array. The first variant of the electrical device has a first housing part, which includes a single recess for a motor-connection piece, and the second variant of the electrical device has a second housing part, which includes a first recess for a first motor-connection piece and a second recess for a second motor-connection piece. For the production of the first variant of the electrical device, the first power module, e.g., as the sole power module, is mounted on the first contact-area array and is connected in an electrically conductive manner to a first motor-connection piece, e.g., a first sole motor-connection piece, which is inserted into the recess of the first housing part, the second contact-area array in particular not being fitted with a component. In contrast to the first variant, for the production of the second variant of the electrical device, a second power module is additionally mounted on the second contact-area array and connected in an electrically conductive manner to a second motor-connection piece, which is inserted into the second recess of the second housing part installed in the electrical device instead of the first housing part, the first motor-connection piece being inserted into the first recess of the second housing part.

This is considered advantageous insofar as it allows the production of electrical devices for the supply of one or two electric motor(s) having an identical circuit board. Each electric motor is able to be supplied from the respective power module independently of the respective other electric motor.

Two electric motors may be supplied with different powers in that two power modules supplying different outputs are able to be fitted.

Two identical circuit boards may be used for an electrical device for the supply of two electric motors and for an electrical device for the supply of one electric motor. Thus, in the method for the production of two variants of an electrical device, a single arrangement of the circuit board is used in different variants. The stocking of different components is able to be reduced, and the environment is better protected.

Further features and aspects of example embodiments of the present invention are described in greater detail with reference to the Figures.

DETAILED DESCRIPTION

Figure 1:
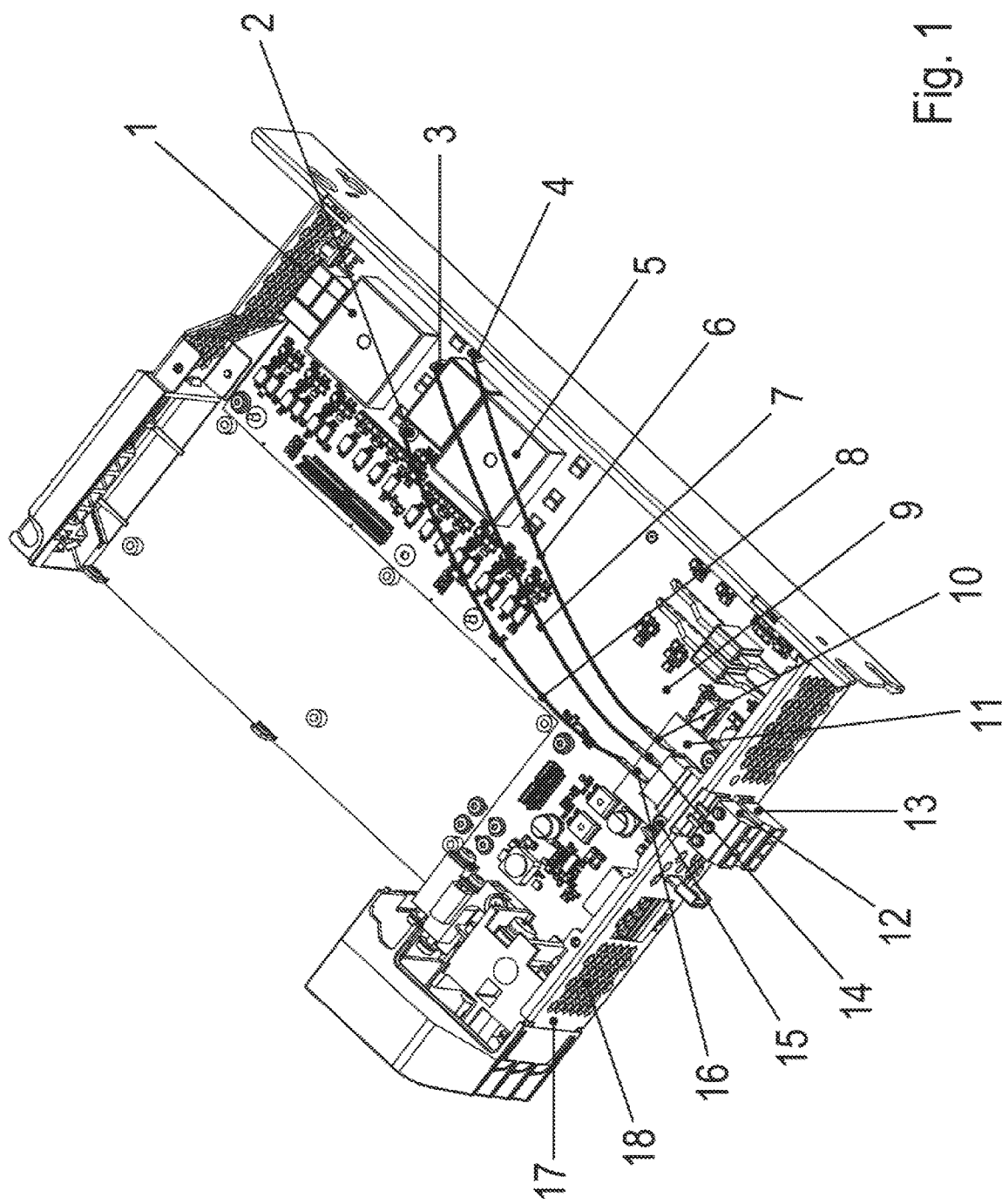
FIG. 1 shows an electrical device according to an example embodiment of the present invention in an oblique view.
Figure 2:
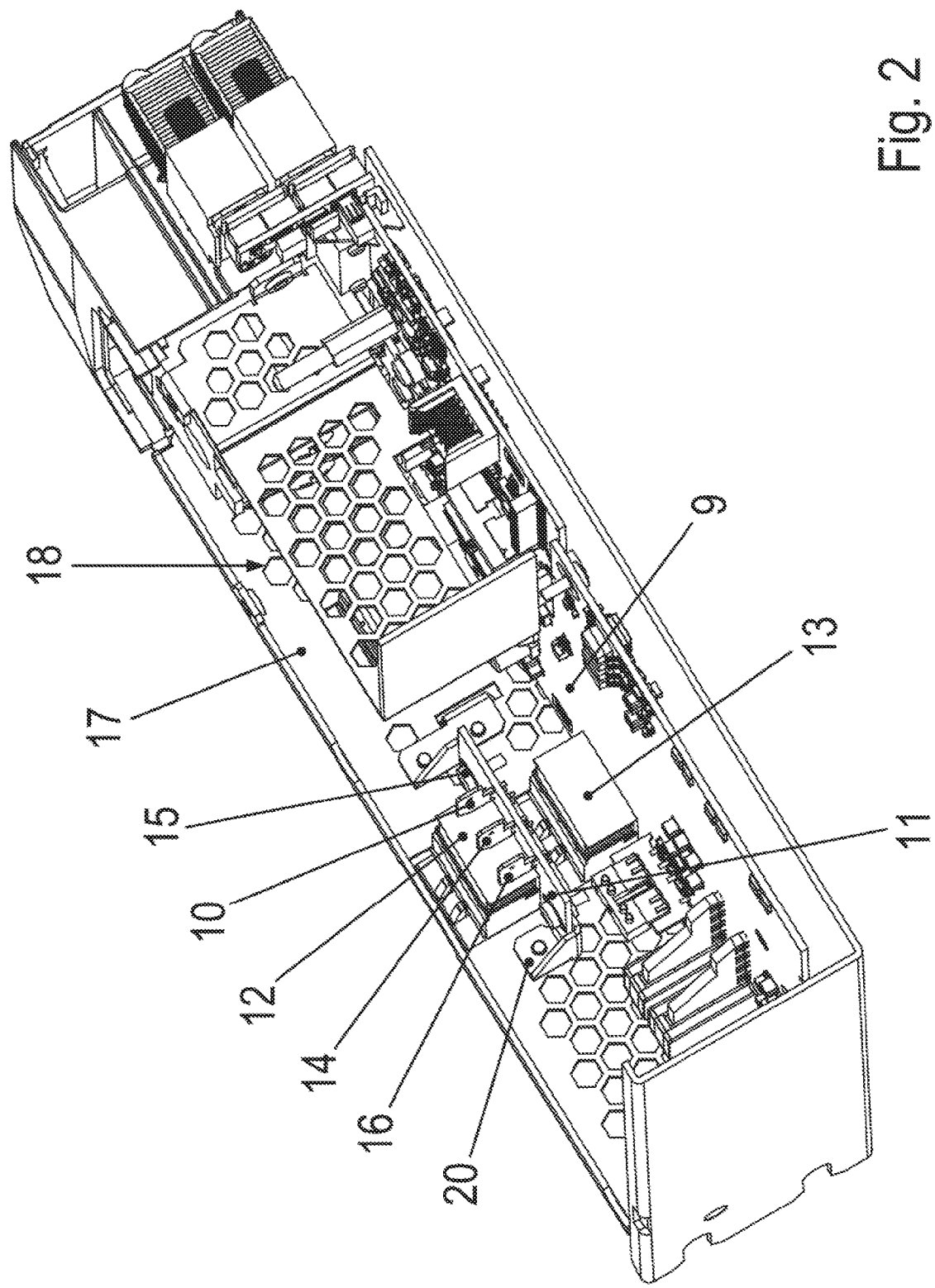
FIG. 2 shows a sectional view of the electrical device.
Figure 3:
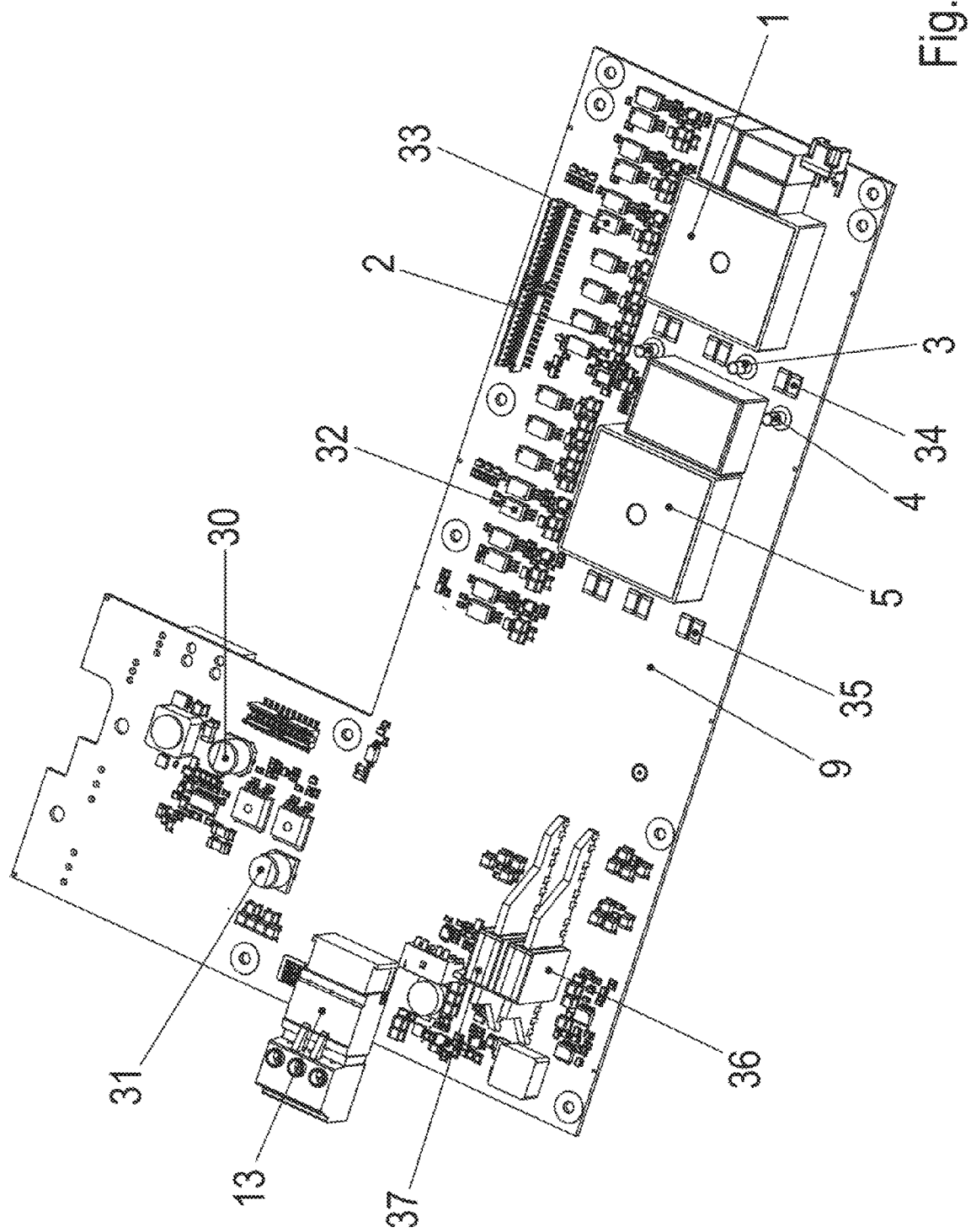
FIG. 3 shows a loaded circuit board of the electrical device.

An electrical device, e.g., a converter, as shown in FIGS. 1 through 3, includes a circuit board 9 on which a first power module 5 and a second power module 1 are mounted.

Circuit board 9 includes contact areas 41 for the electrical contacting of the power modules (1, 5). First contact areas for the contacting of first power module 5 are disposed as a first contact area array. Second contact areas 41 for the contacting of second power module 1 are disposed as a second contact area array.

Each contact area array has at least five contact areas 41, and, e.g., seven to eleven contact areas, especially eleven contact areas. The first and the second contact area arrays are arranged in an identical fashion. The first contact area array is able to be transferred into the second contact area array through translation and rotation in the circuit-board plane of circuit board 9, so that the first and the second contact area arrays cover each other. The first and the second contact area arrays may have an identical number of contact areas 41.

The contact areas may be arranged as vias.

Each power module (1, 5) includes an inverter, which encompasses controllable semiconductor switches, in particular IGBTs. The first power module 5 and the second power module 1 may have different outputs and are suited for the supply of different electric motors.

The electrical device has a rectifier and a constant-voltage DC link that is supplied from there. The first and second power modules (1, 5) may be supplied from a single shared constant-voltage DC link.

First power module 5 is connected in an electrically conductive manner to a first connector piece 13 by circuit traces on circuit board 9. First connector piece 13 is configured for the connection to a first mating connector piece. For instance, the first mating connector piece is connected in an electrically conductive manner to a first electric motor, so that the first electric motor may be supplied by the electrical device and, in particular, may be supplied from first power module 5.

A connector piece (12, 13) for connecting an electric motor may also be referred to as a motor-connector piece.

Second power module 1 is connected to three vias (2, 3, 4) in circuit board 9 with the aid of circuit traces on circuit board 9. Second power module 1 has electrical contact devices for this purpose, which are connected to the circuit traces by soldering.

The vias (2, 3, 4) are connected in an electrically conductive manner to a respective cable (6, 7, 8), for which purpose a first end region of each cable (6, 7, 8) is inserted into the respective via (2, 3, 4) and connected to the respective via (2, 3, 4) by soldering.

A respective second end region of each cable (6, 7, 8) is connected in an electrically conductive manner to a respective connection device (10, 14, 16). The connection devices (10, 14, 16) are situated, in particular mounted, on an additional circuit board 11. A second connector piece 12 is fitted on additional circuit board 11. The connection devices (10, 14, 16) are connected to the second connector piece 12 in an electrically conductive manner with the aid of additional circuit traces on additional circuit board 11. The connection devices (10, 14, 16) and the second connector piece 12 include for that purpose electrical contact devices, which are connected to the additional circuit traces by soldering.

Second connector piece 12 is designed for the connection to a second mating connector piece. The second mating connector piece is electrically conductively connected to a second electric motor, for example, so that the second electric motor is able to be supplied with the aid of the electrical device and in particular, is able to be supplied from second power module 1.

The electrical device has at least one second housing part 17. First connector piece 13 is partially routed through a first recess in second housing part 17 and connected to second housing part 17 and/or circuit board 9, in particular in a force-locking manner, e.g., by clamping. First connector piece 13 may be plugged into second housing part 17.

Second housing part 17 has recesses for ventilation 18. The recesses for the ventilation 18 are designed for ventilating, in particular for convectively cooling, the electrical device.

Second housing part 17 is arranged as a stamped and bent part, in particular as a stamped and bent sheet metal part.

Second connector piece 12 is partially routed through a second recess in second housing part 17 and connected to second housing part 17 and/or additional circuit board 11, in particular in a force-locking manner, e.g., by clamping. Second connector piece 12 may be plugged into second housing part 17.

The first recess, the second recess, and the recesses for ventilation 18 are implemented in the form of continuous recesses.

Additional circuit board 11 is connected to second housing part 17 in a reversible manner. At least one retaining part 20 is connected to second housing part 17, in particular by rivets, for this purpose. Retaining part 20 has at least one bore through which a screw part 15 is able to be guided. Additional circuit board 11 has at least one bore through which screw part 15 may be routed. Using screw part 15, which is guided through the bores and may be fixed in place with the aid of a nut, second circuit board 11 is reversibly connected to retaining part 20.

Retaining part 20 is arranged as a stamped and bent part, in particular as a stamped and bent sheet metal part. Second housing part 17 defines a plane. Additional circuit board 11 may be connected to second housing part 17 such that this plane is situated at a non-vanishing angle to the circuit board plane of additional circuit board 11; the normal vector of the circuit board plane of additional circuit board 11 may be situated at a right angle to the normal vector of the plane of second housing part 17. Retaining part 20, situated on additional circuit board 11, is set apart from second housing part 17.

FIG. 3 shows loaded circuit board 9 of the electrical device.

Circuit board 9 is loaded with first power module 5 and second power module 1, with current-measuring resistors 35 and additional current-measuring resistors 34, with opto-couplers 32 and additional opto-couplers 33, with a transformer 37 and a further transformer 36, and with a brake-control device 30 and an additional brake-control device 31, each of the brake-control devices (30, 31) including a transistor.

With the aid of circuit traces situated on circuit board 9, opto-couplers 32 are connected to transformer 37 in an electrically conductive manner and are supplied by the transformer. First power module 5 is controlled with the aid of opto-couplers 32. Opto-couplers 32 are electrically conductively connected to power module 5 for this purpose with the aid of circuit traces situated on circuit board 9. Current-measuring resistors 35 measure the output current of power module 5. To do so, current-measuring resistors 35 are connected in an electrically conductive manner to first power module 5 by circuit traces located on circuit board 9.

A first brake is able to be controlled by the electrical device, and the electrical device includes a brake-control means 30 toward that end.

Additional opto-couplers 33 are connected in an electrically conductive manner to additional transformer 36 by circuit traces situated on circuit board 9 and are supplied by transformer 36. Second power module 1 is controlled with the aid of additional opto-couplers 33. For this purpose, additional opto-couplers 33 are connected to second power module 1 in an electrically conductive manner with the aid of circuit traces on circuit board 9.

Additional current-measuring resistors 34 measure the output current of second power module 1. To do so, additional current-measuring resistors 34 are connected to second power module 1 in an electrically conductive manner by circuit traces situated on circuit board 9.

A second brake is able to be controlled by the electrical device. The electrical device includes an additional brake-control device 31 for this purpose.

Circuit board 9 has two recesses 40 through which a respective screw means is partially able to be guided in order to connect a respective power module (1, 5) to circuit board 9. Toward that end, the respective power module (1, 5) includes a recess through which the screw devices may be partially routed.

The electrical device includes a heat sink, which is connected in a thermally conductive manner to first power module 5 and to second power module 1. The heat sink may include threaded bores, in particular a separate threaded bore for each power module (1, 5). Thus, the screw device is able to be guided through one of recesses 40 in circuit board 9 and through the recess in the respective power module (1, 5) and connected to the heat sink by screws. The power modules (1, 5) are situated between the heat sink and circuit board 9.

The heat sink has cooling fins and/or cooling fingers. The electrical device may include a fan, which conveys a flow of cool air along the cooling fins and/or cooling fins.

Thus, the electrical device shown in FIGS. 1, 2 and 3 is designed to supply and/or control two independent electric motors having a brake in each case.

An electrical device is suitable for controlling a single electric motor including a brake.

Figure 4:
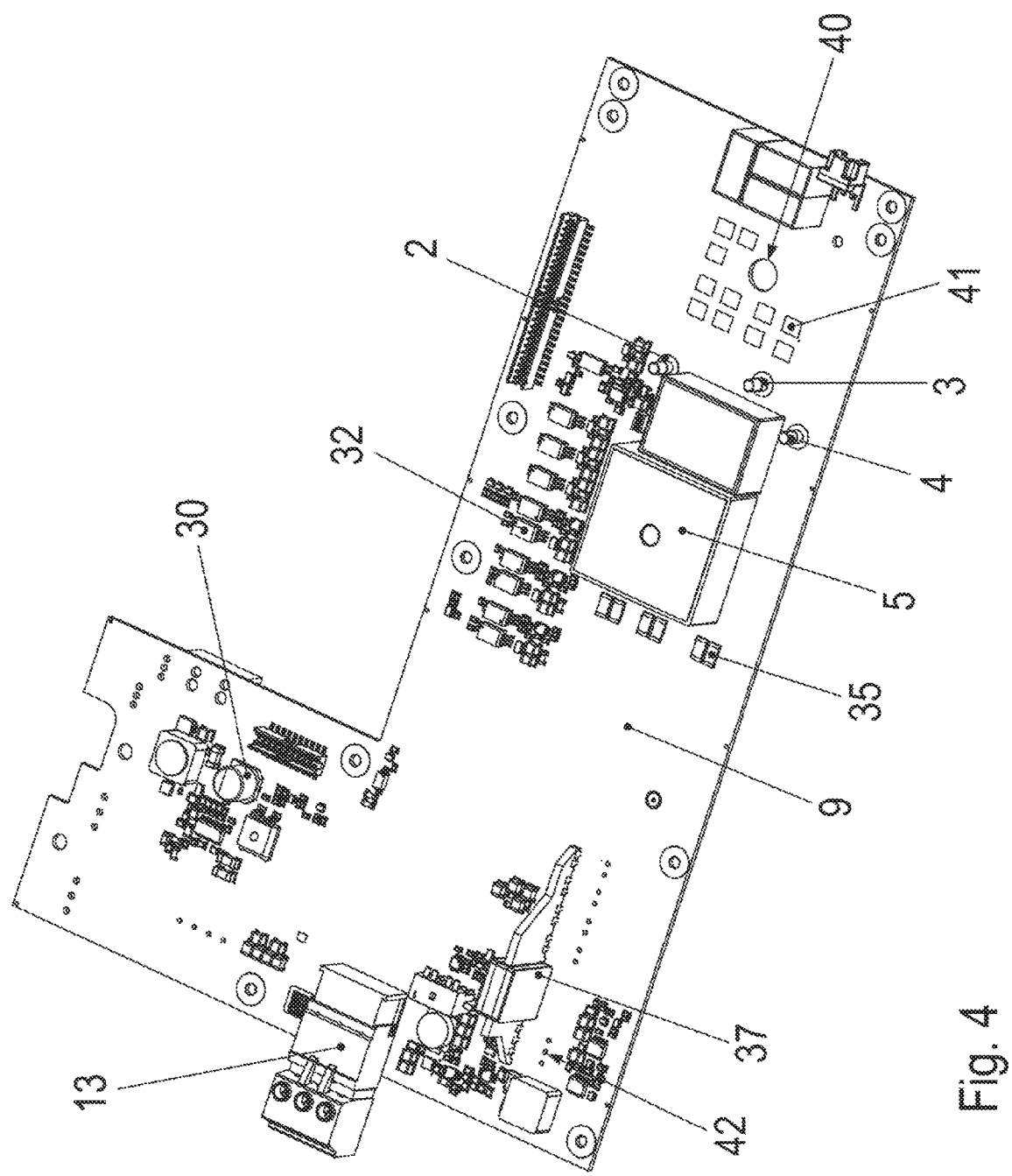
FIG. 4 shows a loaded circuit board of an electrical device according to an example embodiment of the present invention.

Circuit board 9, shown in FIG. 4, of the electrical device has circuit traces that are arranged in the same manner as the circuit traces of circuit board 9 shown in FIG. 3. Thus, circuit boards 9 of the electrical devices illustrated in FIGS. 3 and 4 have an identical design.

Circuit board 9 illustrated in FIG. 4 is fitted with a single first power module 5, current-measuring resistors 35, opto-couplers 32, a transformer 37, and a brake-control device 30. In other words, the second contact-area array is not fitted with a component.

Circuit board 9 includes vias (2, 3, 4), which are connected by circuit traces to a respective contact area 41 of the second contact area array. Contact areas 41 are suitable for the electrical contacting of second power module 1. In the electrical device, vias (2, 3, 4) and contact areas 41 terminate blindly. The vias (2, 3, 4) and contact areas 41 are situated in electrical isolation from electrical components of the electrical device.

In the electrical device, only first power module 5 is mounted on circuit board 9. A recess 40 in circuit board 9, which is suitable for connecting second power module 1 to circuit board 9, is situated at a distance from first power module 5.

The electrical device shown in FIG. 4 has a heat sink whose design is identical to that of the heat sink of the electrical device shown in FIG. 3. First power module 5 is connected to the heat sink in a thermally conductive manner. First power module 5 is disposed between the heat sink and circuit board 9. A threaded bore in the heat sink is situated at a distance from first power module 5.

The electrical device does not include further opto-couplers 33. The insertion slots on circuit board 9 provided for additional opto-couplers 33 remain empty.

Circuit board 9 includes recesses 42, which are suitable for accommodating connection elements of a transformer (36, 37). In the electrical device shown in FIG. 4, these recesses 42 are set apart from connection elements of the transformer (37).

The electrical device has no further current-measuring resistors 34. The circuit traces situated on circuit board 9 for the electrical connection of the additional current-measuring resistors 34 to additional power module 1 terminate blindly in electrical device. Insertion slots on circuit board 9, which are suitable for the additional current-measuring resistors remain empty.

The electrical device has no further brake-control device 31. Therefore, an insertion slot on circuit board 9 that is suitable for further brake-control device 31 remains empty. Thus, the electrical device shown in FIG. 4 is suitable for the control of a single brake.

The insertion slot may be arranged as a via, a plug-in slot or a recess.

The electrical device shown in FIG. 4 includes at least a first housing part. The configuration of the first housing part differs from the configuration of second housing part 17. First connector piece 13 is partially guided through a recess in the first housing part and is connected to the first housing part and/or circuit board 9, in particular in a force-locking manner, e.g., by clamping. Connector piece 13 may be plugged into the first housing part.

The first housing part includes recesses for ventilation purposes. The recesses for the ventilation are designed for ventilating, in particular for convectively cooling, the electrical device.

The first housing part is arranged as a stamped and bent part, in particular as a stamped and bent sheet-metal part.

The recess and the recesses for the ventilation are arranged as continuous recesses.

LIST OF REFERENCE NUMERALS 1 power module
2 via
3 via
4 via
5 power module
6 cable
7 cable
8 cable
9 circuit board
10 connection device
11 circuit board
12 connector piece
13 connector piece
14 connection device
15 screw part
16 connection device
17 housing part
18 recess for ventilation
20 retaining part
30 brake-control device, in particular transistor
31 brake-control device, in particular transistor
32 opto-coupler
33 opto-coupler
34 current-measuring resistor
35 current-measuring resistor
36 transformer
37 transformer
40 recess
41 contact area
42 recess

The invention claimed is:

1. An electrical device, comprising:
a circuit board including circuit traces and including two similar and/or identical contact area arrays transitioning into each other through rotation and/or displacement, a first contact area array of the contact area arrays being fitted with a first power module, a second contact area array adapted to be fitted with a second power module, each power module adapted to supply power to a respective electric motor, the circuit board including a via connected in an electrically conductive manner by way of circuit traces on the circuit board to a contact area of the second contact area array;
an additional circuit board having additional circuit traces and at least one connection device; and
a second connector piece;
wherein the second power module is mounted on the circuit board on the second contact area array, and being connected in an electrically conductive manner to the via by the circuit traces, the second connector piece being fitted on the additional circuit board and connected to the connection device in an electrically conductive manner by the additional circuit traces, the via being connected in an electrically conductive manner to the connection device by a cable.

2. The electrical device according to claim 1, wherein the electrical device is arranged as a converter.

3. The electrical device according to claim 1, further comprising at least one electrical component mounted on the circuit board, the second contact area array is situated in electrical isolation from the at least one electrical component.

4. The electrical device according to claim 3, wherein the electrical component includes a transformer, a current-measuring resistor, an opto-coupler, and/or a brake-control device.

5. The electrical device according to claim 3, further comprising a heat sink connected to the first power module in a thermally conductive manner and adapted to be connected to the second power module in a thermally conductive manner, the heat sink extending parallel to a circuit-board plane of the circuit board, from the first power module to the second contact area array, and set apart from the second contact area array so that the second power module is between the heat sink and the circuit board.

6. The electrical device according to claim 5, wherein the circuit board includes two recesses, and the heat sink includes two threaded bores, each power module including a recess, a screw device being partially passed through one of the recesses in the circuit board and through the recess in a respective power module and being connected to one of the threaded bores by screws, one of the recesses in the circuit board and one of the threaded bores being aligned with each other.

7. The electrical device according to claim 1, wherein the circuit board includes a fitting slot adapted to electrically contact an electrical component of a same type as a first electrical component, the fitting slot being situated at a distance and/or being electrically isolated from the first electrical component, the fitting slot being connected in an electrically conductive manner to a contact area of the second contact area array.

8. The electrical device according to claim 1, further comprising a first housing part and a first connector piece connected in an electrically conductive manner to the first power module by the circuit traces on the circuit board, the first housing part including a recess for the first connector piece, the first connector piece being inserted into the recess.

9. The electrical device according to claim 1, wherein an end region of the cable is inserted into the via is solder-connected to the via.

10. The electrical device according to claim 1, wherein the connection device is provided on the additional circuit board, the additional circuit board having a circuit-board plane, the connection device projecting from the additional circuit board perpendicular to a normal direction of the circuit-board plane, a further end region of the cable being plugged into the connection device.

11. The electrical device according to claim 1, wherein the connection device includes a via in the additional circuit board, a further end region of the cable being inserted into the connection device and solder-connected to the connection device.

12. The electrical device according to claim 1, further comprising a second housing part having a first recess for a first connector piece and a second recess for the second connector piece, the first connector piece being inserted into the first recess, the second connector piece being inserted into the second recess, the additional circuit board being connected to the second housing part in a reversible manner.

13. A system, comprising:
a first electrical device; and
a second electrical device;
each of the first electrical device and the second electrical device having a circuit board including circuit traces, and two similar and/or identical contact area arrays, the contact area arrays transitioning into each other through rotation and/or displacement, a first contact area array being fitted with a first power module, a second contact area array adapted to be fitted with a second power module;
wherein the first electrical device includes a single connector piece adapted for supply of a single electric motor from the first power module, the first electrical device including a first housing part which includes a recess into which the connector piece is inserted, and the second power module not being mounted;
wherein the second electrical device includes a second power module and two connector pieces adapted for supply of two independent electric motors from a respective power module, the second electrical device having a second housing part that differs from the first housing part and has two recesses into which a respective connector piece is inserted;
wherein the second electrical device and the first electrical device differ in that in the second electrical device, the first housing part is replaced by the second housing part, and the second contact area array is fitted with the second power module.

14. The system according to claim 13, wherein the electrical devices include converters.

15. A method for producing two variants of an electrical device having a circuit board that includes circuit traces and two similar and/or identical contact area arrays, the contact area arrays transitioning into each other through rotation and/or displacement, a first contact area array adapted to be fitted with a first power module, a second contact area array adapted to be fitted with a second power module, a first variant of the electrical device having a first housing part, which includes a single recess for a motor-connection piece, a second variant of the electrical device having a second housing part, which includes a first recess for a first motor-connection piece and a second recess for a second motor-connection piece, comprising:
for production of the first variant of the electrical device, mounting the first power module, as a sole power module, on the first contact area array, and connecting the first power module in an electrically conductive manner to a first motor-connection piece, as a sole first motor-connection piece, which is inserted into the recess of the first housing part, and the second contact area array is not fitted with a component; and
for producing of the second variant of the electrical device, additionally mounting a second power module on the second contact area array, which is connected in an electrically conductive manner to the second motor-connection piece, which is inserted into the second recess of the second housing part installed in the electrical device instead of the first housing part, the first motor-connection piece being inserted into the first recess of the second housing part.

16. The method according to claim 15, wherein the electrical devices include converters.

* * * * *